United States Patent
Lin et al.

(10) Patent No.: US 7,973,293 B2
(45) Date of Patent: Jul. 5, 2011

(54) IMPLANTATION QUALITY IMPROVEMENT BY XENON/HYDROGEN DILUTION GAS

(75) Inventors: Yu-Peng Lin, Kaohsiung County (TW); Wei-Ming You, Taipei (TW); Ruey-Yong Deng, Pingtung County (TW); Jiunn-Nan Lin, Pingtung County (TW); Sheng-Chien Tung, Tainan (TW); Pin Chia Su, Tainan County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 204 days.

(21) Appl. No.: 12/416,725

(22) Filed: Apr. 1, 2009

(65) Prior Publication Data

US 2010/0176306 A1    Jul. 15, 2010

Related U.S. Application Data

(60) Provisional application No. 61/143,492, filed on Jan. 9, 2009.

(51) Int. Cl.
*H01J 37/317* (2006.01)

(52) U.S. Cl. ............. 250/426; 250/423 R; 250/424
(58) Field of Classification Search ............... 250/426, 250/423 R, 424, 425, 492.21
See application file for complete search history.

(56) References Cited

U.S. PATENT DOCUMENTS

7,586,109 B2 *  9/2009  Perel et al. ........... 250/492.21
2008/0179545 A1  7/2008  Perel

OTHER PUBLICATIONS

Designing Tracks for Better CD Control—Sep. 1, 2003—Semiconductor International, pp. 1 of 9 at http://www.semiconductor.net/article/CA319214.html Dec. 14, 2008.

\* cited by examiner

*Primary Examiner* — Kiet T Nguyen
(74) *Attorney, Agent, or Firm* — Duane Morris LLP; Steven E. Koffs

(57) ABSTRACT

A method comprises supplying a dopant gas in an arc chamber of an ion source. A dilutant is supplied to dilute the dopant gas. The dilutant comprises about 98.5 wt. % xenon and about 1.5 wt. % hydrogen. An ion beam is generated from the diluted dopant gas using the ion source.

20 Claims, 5 Drawing Sheets

IMPLANTATION QUALITY IMPROVEMENT BY XENON/HYDROGEN DILUTION GAS

This application claims the benefit of U.S. Provisional Application No. 61/143,492, filed Jan. 9, 2009, which application is expressly incorporated by reference herein in its entirety.

FIELD OF THE INVENTION

The present disclosure relates to semiconductor fabrication generally and ion beam generation in particular.

BACKGROUND

Extrinsic semiconductors rely on dopants to provide a desired density of charge carriers. Dopant implantation is a major step in extrinsic semiconductor processing. In conventional CMOS manufacturing, an ion beam implants dopants into the wafer. Chemical species are deposited into semiconductor wafers by bombarding the substrate with energized ions. The amount of dopant deposited controls the type and conductivity of the resulting semiconductor. The ability to control the active device characteristics depends on the ability to deposit a predetermined dosage of a dopant uniformly throughout the various regions of the substrate.

Commercially available ion implanter systems are used to perform implantation. The implanter includes an ion source head, which generates the energized ions. It has been observed experimentally that the source head lifetime was shorter when used to implant Ge than other species, such as As, B, $BF_2$, and P. More severe tool symptoms were observed during Germanium (Ge) implantation, resulting in worse source head condition and poor beam uniformity and stability. The inventors observed a high current implanter experience poor source head life time during Ge implantation—as short as 10 hours mean time between failure. It was observed that $WF_6$ whiskers were deposited on the aperture of the arc chamber of the ion source, degrading beam uniformity. The whiskers were the result of the tungsten material of the arc chamber wall being consumed in the following reaction:

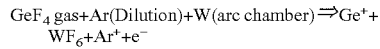

$GeF_4$ gas+Ar(Dilution)+W(arc chamber)$\Rightarrow Ge^+$+ $WF_6+Ar^++e^-$

The beam uniformity (measured as a ratio of the standard deviation of the beam current divided by the maximum beam current value) across the length of 300 mm was observed to be about 0.84%.

U.S. Patent Application Publication No. US 2008/0179545 A1, published Jul. 31, 2008 and entitled "Technique for Improving the Performance and Extending the Lifetime of an Ion Source with Gas Dilution" ("Perel et al.) is incorporated by reference herein in its entirety. Perel et al. describes an ion implanter system, an ion source therefor and a method for operating the ion source.

Perel et al. propose diluting the dopant gas with a dilutant gas containing 70% xenon (Xe) and 30% hydrogen ($H_2$). The dilutant gas made up 10% to 40% of the total gas in the arc chamber with a preferred composition of 20% dilutant and 80% dopant gas. Perel et al. report reduced weight gain of ion source components with this combination.

Improved methods are desired.

SUMMARY OF THE INVENTION

In some embodiments, a method comprises supplying a dopant gas in an arc chamber of an ion source. A dilutant is supplied in the arc chamber to dilute the dopant gas. The dilutant comprises about 98.5 wt. % xenon and 1.5 wt. % hydrogen. An ion beam is generated from the diluted dopant gas using the ion source.

In some embodiments, a method comprises supplying a dopant gas in an arc chamber of an ion source. A dilutant is supplied in the arc chamber to dilute the dopant gas. The dilutant comprises xenon and hydrogen. The diluted dopant gas comprises about 44 wt % dopant gas and about 56 wt % dilutant. An ion beam is generated from the diluted dopant gas using the ion source.

In some embodiments, an apparatus comprises an ion source for generating an ion beam. The ion source including an arc chamber. A diluted dopant means is provided for supplying a dopant gas to the arc chamber and for supplying a dilutant to dilute the dopant gas in the arc chamber. The diluted dopant gas is usable for generating the ion beam using the ion source. The dilutant comprises xenon and hydrogen. A controller is provided for controlling the dopant supply means and the dilutant supply means, so that the diluted dopant gas comprises about 44 wt % dopant gas and about 56 wt % dilutant.

DETAILED DESCRIPTION

Figure 1:
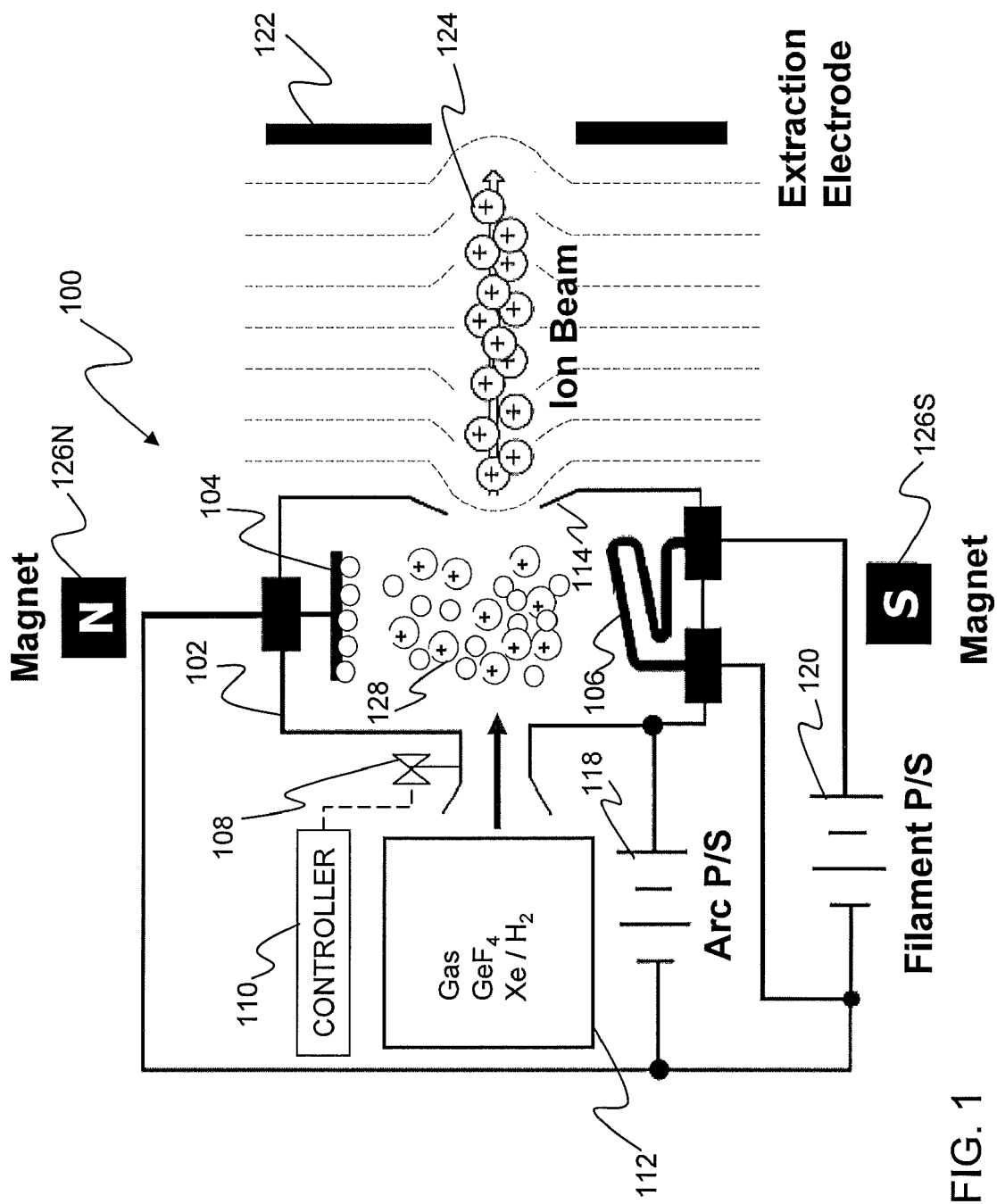
FIG. 1 is a schematic diagram of an ion source of an ion implanter system.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 is a schematic diagram of an apparatus according to one embodiment. The apparatus comprises an ion source 100 for generating an ion beam 124. The ion source 100 includes an arc chamber 102. The arc chamber 102 has an anode 104 and a heated cathode 106. A filament power supply 120 provides power to heat the cathode 106, causing acceleration of electrons toward the cathode 106. An arc power supply 118 supplies the power to the chamber housing to accelerate electrons emitted by the cathode 106 into a plasma. A magnet or set of magnets 126N, 126S is provided to establish a magnetic field for the ion beam formation. The arc chamber has an aperture 114, through which the ion beam passes. An extraction electrode 122 shapes and defines the ion beam 124 as it leaves the ion source 100.

Gas 128 is supplied to the arc chamber from a gas source 112. In some embodiments, the gas source is a reservoir 112 containing the dopant mixed with the dilutant gas.

The exemplary apparatus 100 of FIG. 1 includes reservoir 112 containing a mixture of dopant gas (e.g., $GeF_4$) and dilutant gas (e.g., xenon and hydrogen). The dopant gas may comprise Ge, As, B, $BF_2$, P, or other species to be implanted in semiconductor substrates. In one embodiment, the dopant gas is $GeF_4$. The dilutant gas may be purchased or otherwise provided in a vessel, such as a bottle. For example, the vessel may by a gas bottle or container sold by Praxair Corporation of Danbury, Conn. Such product may be loaded with nominally equal parts by volume of xenon and hydrogen, and may contain about 250 grams Xe and about 4 grams $H_2$, or 98.4 wt. % Xe and 1.6 wt. % $H_2$. The dilutant may vary from about 48% to about 50 xenon molecules and from about 50% to about 52% hydrogen molecules. In one example, the molecules in the dilutant are 48.6% Xe molecules and 51.4% $H_2$. In other embodiments, the dilutant may include a different inert gas, such as Argon.

Figure 2:
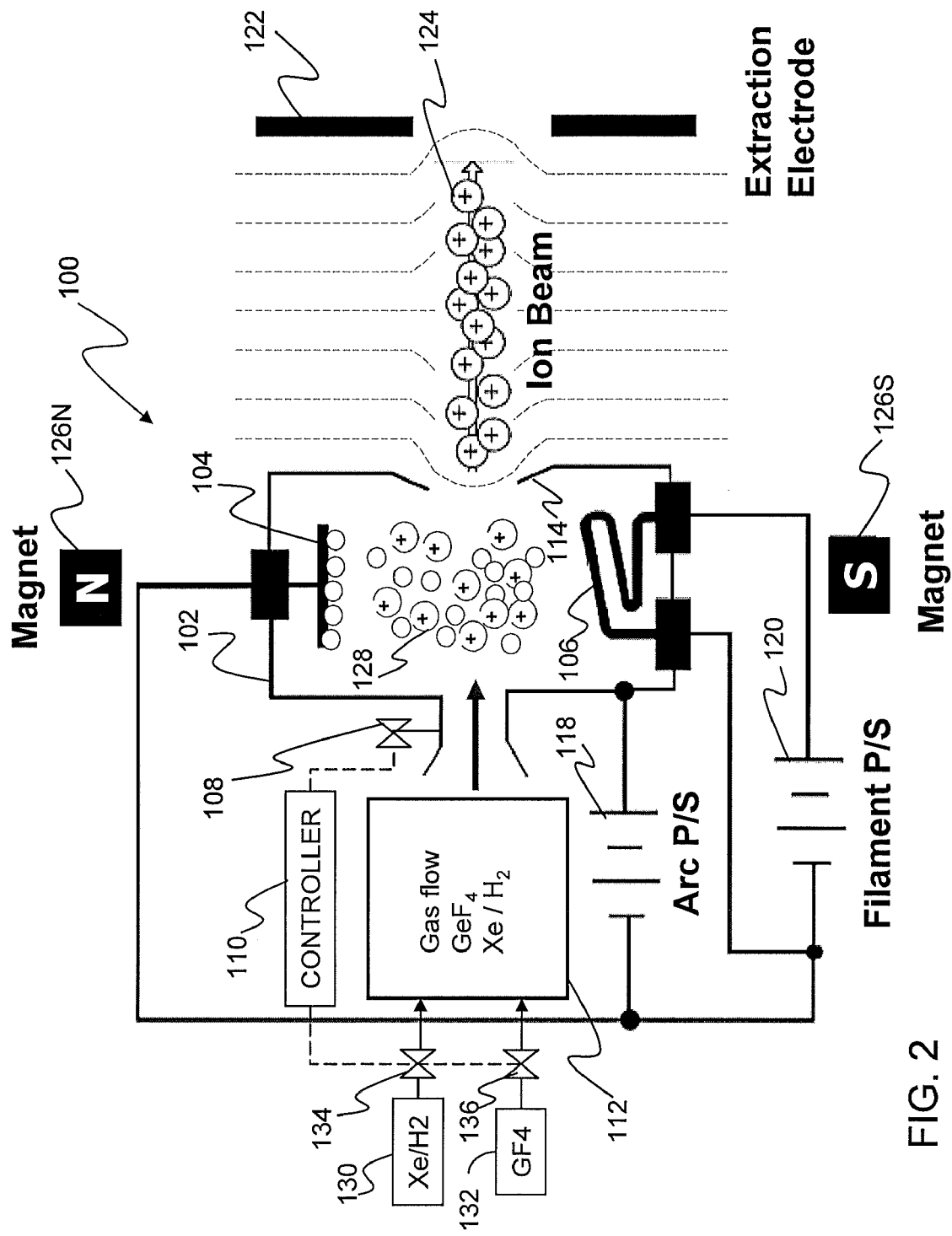
FIG. 2 is a schematic diagram of the ion source of FIG. 1 with an optional gas feed.

Optionally, the apparatus 100 may include a diluted dopant means for supplying diluted dopant to the arc chamber 102 under automatic control. FIG. 2 shows the apparatus of FIG. 1, with an optional automatic feed added. Identical items in FIGS. 1 and 2 have the same reference numerals.

In the embodiment of FIG. 2, the diluted dopant means includes a dopant supply means for supplying dopant gas to the arc chamber 102 via a mixing chamber. The apparatus 100 also includes a dilutant supply means for supplying a dilutant to the arc chamber 102 via the mixing chamber 112, to dilute the dopant gas. In the embodiment of FIG. 2, a dopant gas and dilutant gas are mixed in the mixing chamber or reservoir 112 and the diluted dopant gas is provided at the inlet of the arc chamber 102. In other embodiments (described below with reference to FIG. 3), the arc chamber has separate inlets for receiving the dopant gas and at least one dilutant gas, directly from respective gas feeds. For example, the arc chamber may have an inlet for receiving a dopant gas and two additional inlets for receiving dilutant gases, which are mixed with the dopant in the arc chamber.

Referring again to FIG. 2, the dilutant supply means include a dilutant gas supply 130 and a dilutant gas flow control valve 134 operated under control of a controller 110. The dilutant gas supply 130 contains the dilutant composition to be used to dilute the dopant gas for ion generation. In some embodiments, the dilutant is a mixture of xenon gas and hydrogen in a 1:2 atomic ratio (i.e., one molecule of xenon per molecule of $H_2$), such as a bottled mixture supplied by the Praxair Corporation of Danbury, Conn. Alternatively, if supplied separately at the same temperature and pressure, the xenon and hydrogen gases are supplied to dilutant gas supply 130 in approximately equal volumes.

Similarly, the dopant supply means may include a dopant reservoir 132 and a control valve 136 operated under control of the controller 110. The dopant gas may comprise Ge, As, B, $BF_2$, P, or other species to be implanted in semiconductor substrates. In one embodiment, the dopant gas is $GeF_4$.

The controller 110 controls the flow control valve 136 of the dopant supply means and the flow control valve 134 of the dilutant supply means, so that the diluted dopant gas in mixing chamber 112 comprises about 44 wt % dopant gas and about 56 wt % dilutant. The controller 110 also controls an inlet valve 108 that controls flow of the diluted dopant gas from the mixing chamber 112 into the arc chamber 102.

In some embodiments, the controller 110 is a programmable logic controller (PLC). The controller 110 provides signals (e.g., analog signals) to operate the flow control valves 108, 134 and 136, and may collect flow rate data. The controller 110 may optionally be coupled to a processor (not shown) that provides a human-machine interface to permit programming of the controller 110 using a high level language. In other embodiments, the controller 110 may be a microcontroller or processor with an interface card to permit issuance of control signals for operating the valves 108, 134 and 136.

In other embodiments, the gas source includes a plurality of reservoirs or conduits that feed individual constituents directly into the arc chamber 102 to be mixed within the chamber.

Figure 3:
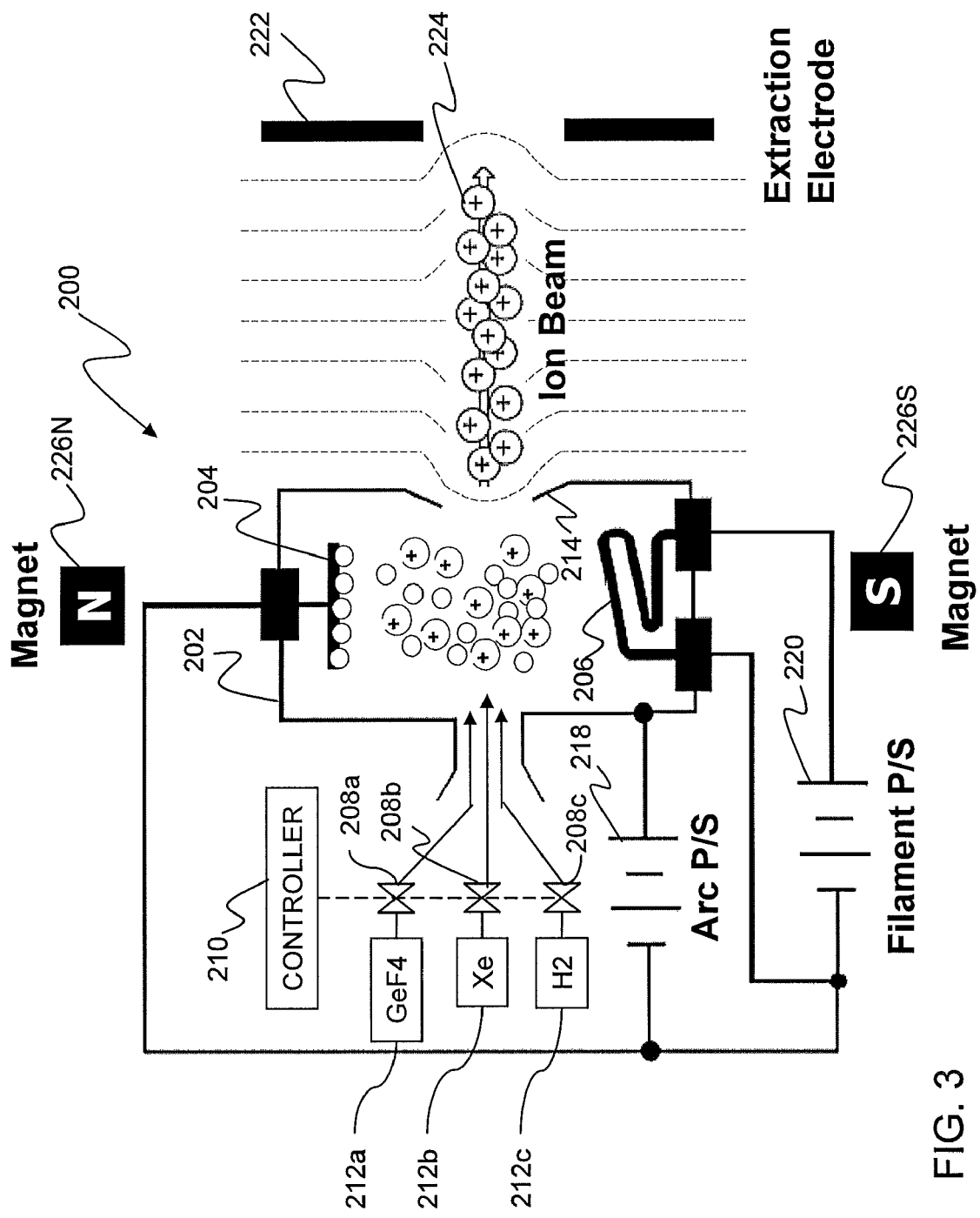
FIG. 3 is a variation of the ion source of FIG. 1, having separate gas supply lines to the arc chamber.

For example, FIG. 3 shows an alternative embodiment in which the reservoir 112 is omitted, and the dilutant supply means and the dopant supply means have separate conduits for supplying the dilutant and dopant, respectively, to the arc chamber 202. Items in FIG. 3 that are the same as those in FIG. 2 are indicated by a reference numeral having the same two least significant digits, but increased by 100.

In FIG. 3, the dopant supply means include a dopant supply 212a, with an associated control valve 208a. The dilutant supply means include a xenon supply 212b, with an associated control valve 208b, and a hydrogen supply 212c with an associated control valve 208c. The Control valves 208a to 208c are all fluidly coupled to the arc chamber 202 to deliver the constituents directly to the arc chamber 202 where they are mixed. For a given period of time, the controller 210 is configured to control the control valves 208b and 208c to dispense substantially equal volumes of xenon and hydrogen into the arc chamber 202 (assuming the xenon and hydrogen are at equal temperatures and pressures). The controller 210 is also configured to control the valve 208a to dispense a volume of $GF_4$ gas that is 0.7 times the volume of xenon dispensed (assuming the xenon and $GF_4$ are at equal temperatures and pressures). In other words, the controller 210 controls the valves 208a-208c to dispense substantially equal numbers of xenon and hydrogen molecules, and a number of molecules of $GF_4$ that is about 0.7 times the number of molecules of xenon.

Figure 4:
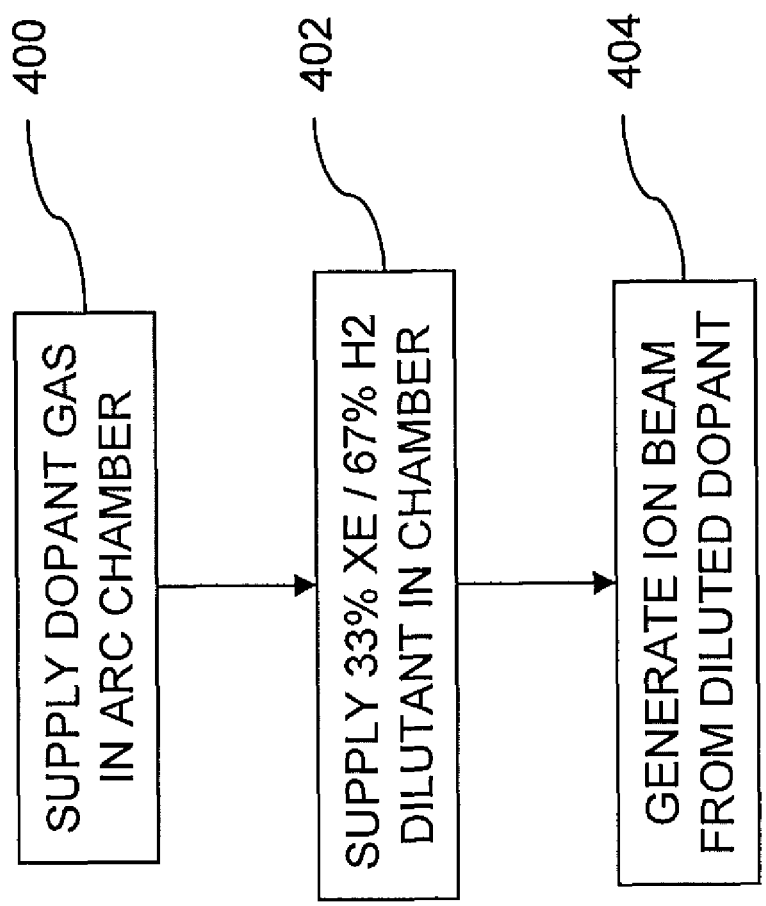
FIG. 4 is a flow chart of a first exemplary method.

FIG. 4 is a flow chart of an exemplary method of using the apparatus of FIG. 2 or the apparatus of FIG. 3.

At step 400, a dopant gas is supplied to an arc chamber 102 of an ion source 100. The dopant may comprise any species suitable for implantation in a semiconductor wafer. For example, Ge, As, B, $BF_2$, and P. The dopant gas may also comprise a halogen, such as fluorine. In one embodiment, a GeF4 gas is supplied to the arc chamber 102.

At step 402, a dilutant is supplied to the arc chamber to dilute the dopant gas. The dilutant comprises about 98.5 wt. % xenon and about 1.5 wt. % hydrogen (or approximately equal volumes of xenon and hydrogen at the same temperature and pressure). The dilutant may be input from the same inlet as the dopant or from a separate inlet.

At step 404, an ion beam is generated from the diluted dopant gas using the ion source. Improved ion source mean time between failure (MTBF) is provided using this dilutant gas.

Figure 5:
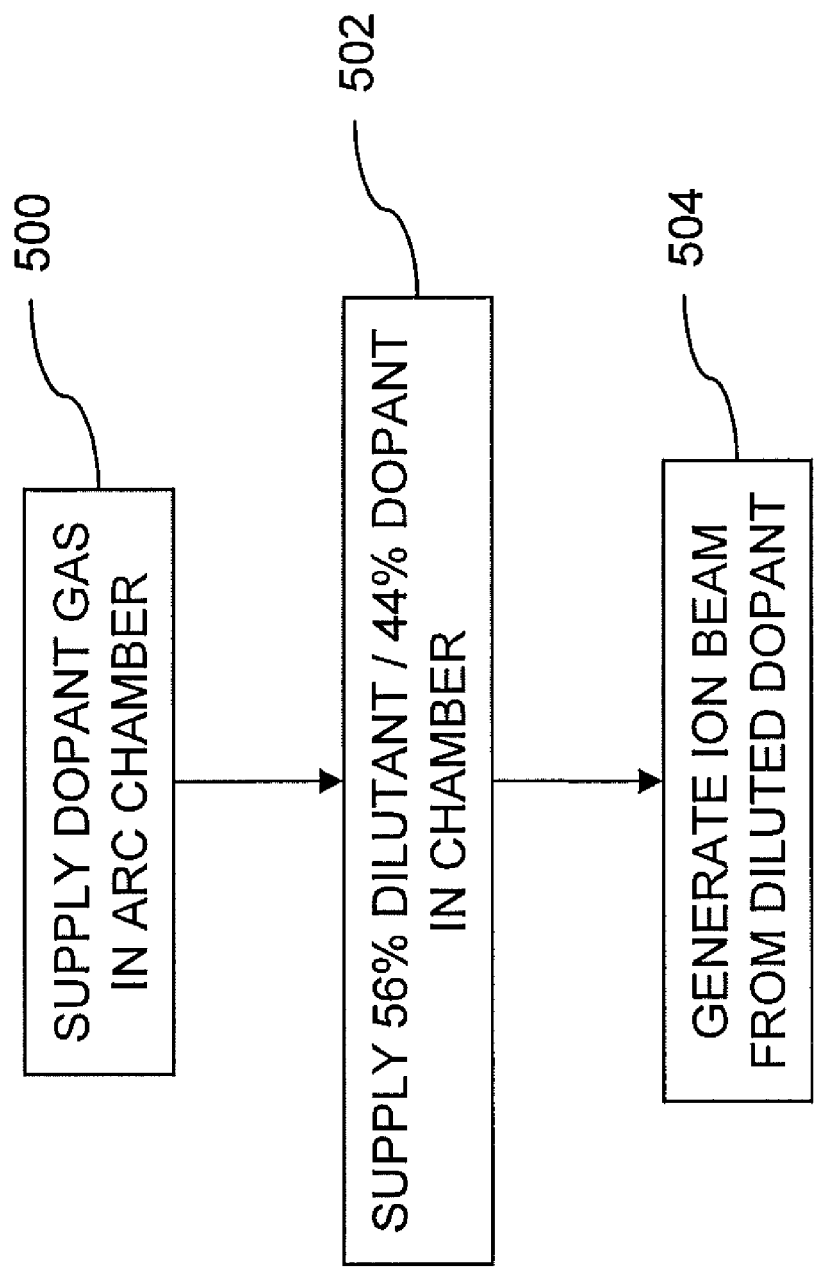
FIG. 5 is a flow chart of a second exemplary method.

FIG. 5 is a flow chart of an exemplary method of using the apparatus

At step 500, a dopant gas is supplied to an arc chamber 102 of an ion source 100.

At step 502, a dilutant is supplied to the arc chamber to dilute the dopant gas. The dilutant comprises xenon and hydrogen. The diluted dopant gas comprises between 40 wt % and 50 wt % dopant gas and between 50 wt % and 60 wt % dilutant. In one embodiment, the diluted dopant gas comprises about 44 wt % dopant gas and about 56 wt % dilutant. The dilutant may be input from the same inlet as the dopant or from a separate inlet.

At step 504, an ion beam is generated from the diluted dopant gas using the ion source. Improved ion source mean time between failure (MTBF) is provided using this ratio of dilutant to dopant gas.

Table 1 provides data from two tests that were conducted using $GeF_4$ as the dopant gas and a mixture of Xe and $H_2$ as a dilutant. "Condition 1" represents a gas mixture as specified in U.S. Patent Application Publication No. US 2008/0179545 A1. The ion source was capable of providing an ion beam for a sufficient period to perform implantation on 869 wafers. "Condition 2" represents a mixture with 56% dilutant gas as described herein. an ion source of the same type used in Condition 1 could now process 1134 wafers under the parameters of condition 2,

TABLE 1

| Gas | Condition 1 Gas Flow (sccm) | Condition 2 Gas Flow (sccm) |
| --- | --- | --- |
| GeF4 (Process gas) | 1.3 | 1 |
| Xe/H2 (Dilution Gas) | 0.3 | 1.3 |
| Flow Ratio: Xe/H2/(GeF4 + Xe/H2) | 18.75% | 56.52% |
| Continually Run Ge IMP (Wafers) | 869 | 1134 |

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising:
    supplying a dopant gas in an arc chamber of an ion source;
    supplying a dilutant to dilute the dopant gas, the dilutant comprising about 98.5 wt. % xenon and about 1.5 wt. % hydrogen; and
    generating an ion beam from the diluted dopant gas using the ion source.

2. The method of claim 1, wherein the diluted dopant gas comprises between 40 wt % and 50 wt % dopant gas and between 50 wt % and 60 wt % dilutant.

3. The method of claim 2, wherein the diluted dopant gas comprises about 44 wt % dopant gas and about 56 wt % dilutant.

4. The method of claim 3, wherein the dopant gas comprises Germanium.

5. The method of claim 3, wherein the dopant gas comprises a halogen.

6. The method of claim 5, wherein the dopant gas comprises fluorine.

7. The method of claim 3, wherein the dopant gas comprises GeF4.

8. A method comprising:
    supplying a dopant gas to an arc chamber of an ion source;
    supplying a dilutant to dilute the dopant gas, the dilutant comprising xenon and hydrogen, wherein the diluted dopant gas comprises from 40 wt. % to 50 wt. % dopant gas and from 50 wt. % to 60 wt. % dilutant; and
    generating an ion beam from the diluted dopant gas using the ion source.

9. The method of claim 8, wherein the diluted dopant gas comprises about 44 wt % dopant gas and about 56 wt % dilutant.

10. The method of claim 8, wherein the dilutant comprises about 98.5 wt. % xenon and about 1.5 wt. % hydrogen.

11. The method of claim 8, wherein the dopant gas comprises Germanium.

12. The method of claim 8, wherein the dopant gas comprises a halogen.

13. The method of claim 8, wherein the dopant gas comprises GeF4.

14. Apparatus comprising:
    an ion source for generating an ion beam, the ion source including an arc chamber;
    diluted dopant means for supplying a dopant gas to the arc chamber and for supplying a dilutant to dilute the dopant gas, the diluted dopant gas being usable for generating the ion beam using the ion source, the dilutant comprising xenon and hydrogen; and
    a controller for controlling the diluted dopant means, so that the diluted dopant gas comprises about 44 wt % dopant gas and about 56 wt % dilutant.

15. The apparatus of claim 14, wherein the diluted dopant means includes a dilutant supply means for supplying the dilutant to the diluted dopant means, wherein the controller includes means for controlling the dilutant supply means, so that the dilutant comprises about 98.5 wt. % xenon and about 1.5 wt. % hydrogen.

16. The apparatus of claim 15, wherein the diluted dopant means includes a dopant supply means, wherein the controller includes means for controlling the dopant supply means, to maintain the diluted dopant gas at about 44 wt % dopant gas and about 56 wt % dilutant.

17. The apparatus of claim 16, wherein the dopant supply means include a dopant source having a control valve, and the controller is configured to control the control valve of the dopant source to dispense the dopant gas into the arc chamber.

18. The apparatus of claim 15, wherein the dilutant supply means includes a xenon source having a first control valve and a hydrogen source having a second control valve, and the controller is configured to control the first and second control valves to dispense substantially equal volumes of xenon and hydrogen into the arc chamber.

19. The apparatus of claim 15, wherein the dilutant supply means include a xenon source having a first control valve and a hydrogen source having a second control valve, and the controller is configured to control the first and second control valves to dispense substantially equal volumes of xenon and hydrogen into a mixing chamber that is fluidly coupled to the arc chamber.

20. The apparatus of claim 19, further comprising a dopant supply means including a dopant source having a third control valve, wherein the controller is configured to control the third control valve to dispense the dopant gas into the arc chamber, so that a volume of the dopant gas is about 0.7 times a volume of the dilutant.

* * * * *